(12) United States Patent
Bugeja

(10) Patent No.: US 6,650,265 B1
(45) Date of Patent: Nov. 18, 2003

(54) METHOD AND ARCHITECTURE FOR VARYING POWER CONSUMPTION OF A CURRENT MODE DIGITAL/ANALOG CONVERTER IN PROPORTION TO PERFORMANCE PARAMETERS

(75) Inventor: Alexander Bugeja, Acton, MA (US)

(73) Assignee: Engim, Inc., Acton, MA (US)

( * ) Notice: Subject to any disclaimer, the term of this patent is extended or adjusted under 35 U.S.C. 154(b) by 0 days.

(21) Appl. No.: 10/133,976

(22) Filed: Apr. 25, 2002

Related U.S. Application Data

(60) Provisional application No. 60/287,395, filed on Apr. 30, 2001.

(51) Int. Cl.[7] .............................. H03M 1/20; H03M 1/66
(52) U.S. Cl. ....................... 341/144; 341/131; 341/145
(58) Field of Search ................................. 341/144, 136, 341/120, 145, 154, 118, 131

(56) References Cited

U.S. PATENT DOCUMENTS

| | | | | |
|---|---|---|---|---|
| 6,329,941 B1 | * | 12/2001 | Farooqi | 341/145 |
| 6,346,899 B1 | * | 2/2002 | Hadidi | 341/144 |
| 6,392,573 B1 | * | 5/2002 | Volk | 341/118 |
| 6,424,283 B2 | * | 7/2002 | Bugeja et al. | 341/145 |
| 6,448,917 B1 | * | 9/2002 | Leung et al. | 341/144 |
| 6,489,905 B1 | * | 12/2002 | Lee et al. | 341/120 |
| 6,507,295 B2 | * | 1/2003 | Volk | 341/118 |
| 6,507,296 B1 | * | 1/2003 | Lee et al. | 341/120 |

* cited by examiner

Primary Examiner—Patrick Wamsley
(74) Attorney, Agent, or Firm—Edward C. Kwok; MacPherson Kwok Chen & Heid LLP

(57) ABSTRACT

A method and circuit structure scale the power consumption of a current mode digital/analog converter (DAC) in proportion to performance parameters, such as sampling speed (i.e., clock samples per second) and resolution (number of bits) under programmable control. In one embodiment, a current mode segmented DAC provided approaches the performance of custom implementations designed for specific combinations of these parameters, across a wide range of such parameters by varying current relative to the sampling rate and the resolution and by selectively enabling current sources in the DAC.

23 Claims, 4 Drawing Sheets

METHOD AND ARCHITECTURE FOR VARYING POWER CONSUMPTION OF A CURRENT MODE DIGITAL/ANALOG CONVERTER IN PROPORTION TO PERFORMANCE PARAMETERS

CROSS-REFERENCE TO RELATED APPLICATIONS

The present application relates and claims the benefit of prior-filed provisional application, Ser. No. 60/287,395, entitled "METHOD AND ARCHITECTURE FOR VARYING THE POWER CONSUMPTION OF A CURRENT-MODE DIGITAL/ANALOG CONVERTER IN PROPORTION TO PERFORMANCE PARAMETERS," filed Apr. 30, 2001.

BACKGROUND OF THE INVENTION

1. Field of the Invention

The present invention relates to the design of current mode digital/analog converters (DACs). In particular, the present invention relates to the design of a current mode DAC having a power consumption which scales with variations in operating sampling speed and resolution.

2. Description of the Related Art

A conventional current mode DAC is typically designed for a particular combination of sampling speed and resolution, and is not optimized across a wide range of such parameter values. That is, although such a DAC can operate with a lower effective resolution or run at a lower speed simply by turning off bit inputs or by lowering the clock input rate, the power consumed by the DAC does not scale appropriately with the parameter variation to be comparable to a custom-designed DAC for the lower resolution or the lower clock rate.

SUMMARY OF THE INVENTION

The present invention provides a method and a structure of a current mode segmented digital/analog converter ("DAC") that scales power consumption over wide ranges of resolutions and sampling rates.

According to the present invention, the DAC of the present invention scales power consumption with the variation in sampling rate, by varying the currents in the current sources, by selectively enabling and disabling current sources in the MSB and the LSB segments of the DAC, or both. In one embodiment, by selectively enabling and disabling current sources, the time constants at the switching node can remain unchanged by maintaining substantially constant current densities. In another embodiment, a phase-locked loop circuit tracks the sampling rate, and the output voltage of the phase-locked loop controls the current in the current sources of the DAC in proportion with the variation in sampling rate.

According to the present invention, the DAC of the present invention scales power consumption with the variation in the required resolution of the DAC, by varying the currents in the current sources, by selectively enabling and disabling current sources in the MSB and the LSB segments of the DAC, or both. In one embodiment, the currents in the current sources of the DAC are varied according to a change in resolution. In another embodiment, the current sources in the MSB segment of the DAC are selectively enabled or disabled in accordance with the change in resolution. In this second embodiment, because the current densities in the current sources can remain substantially constant, the time constants of the DAC can remain unchanged.

Thus, according with one embodiment of the present invention, a current mode segmented DAC of a maximum resolution N includes: (a) a first segment of the DAC receiving M input bits; (b) a second segment of the current mode segmented DAC receiving L input bits, such that the total number of bits M+L exceed the required maximum resolution N; and (c) a control circuit that enables and disables the current sources in the first and second segments. In one implementation, for static linearity reasons, the first segment current sources are thermometer encoded, while the second segment current sources are subdivided into a thermometer encoded group and a binary encoded group.

According to another aspect of the present invention, the currents in DAC current sources are adjustable in response to a bias voltage, so that when the bias voltage is set according to a variation of a performance parameter (e.g., sampling rate or a change in resolution), the power consumption of the DAC is adjusted to scale with the change in parameter. In one embodiment of the present invention, the currents in the DAC are set from a circuit including a phase-locked loop and a linear transconductor.

According to another aspect of the present invention, the output voltage swing at the output terminals of the DAC is maintained by relating the voltage at an external resistor to a virtual resistor at the output terminals of the DAC. The voltage at the external resistor is set by a variable bias voltage of a current source coupled in series with the external resistor.

The present invention is better understood upon consideration of the detailed description below and the accompanying drawings.

BRIEF DESCRIPTION OF THE DRAWINGS

In the present disclosure, like objects which appear in more than one figure are provided with like reference numerals.

DETAILED DESCRIPTION OF THE PREFERRED EMBODIMENTS

The present invention provides a method and a structure of a current mode segmented digital/analog converter ("DAC") that scales power consumption over wide ranges of resolutions and sampling rates.

Figure 1:
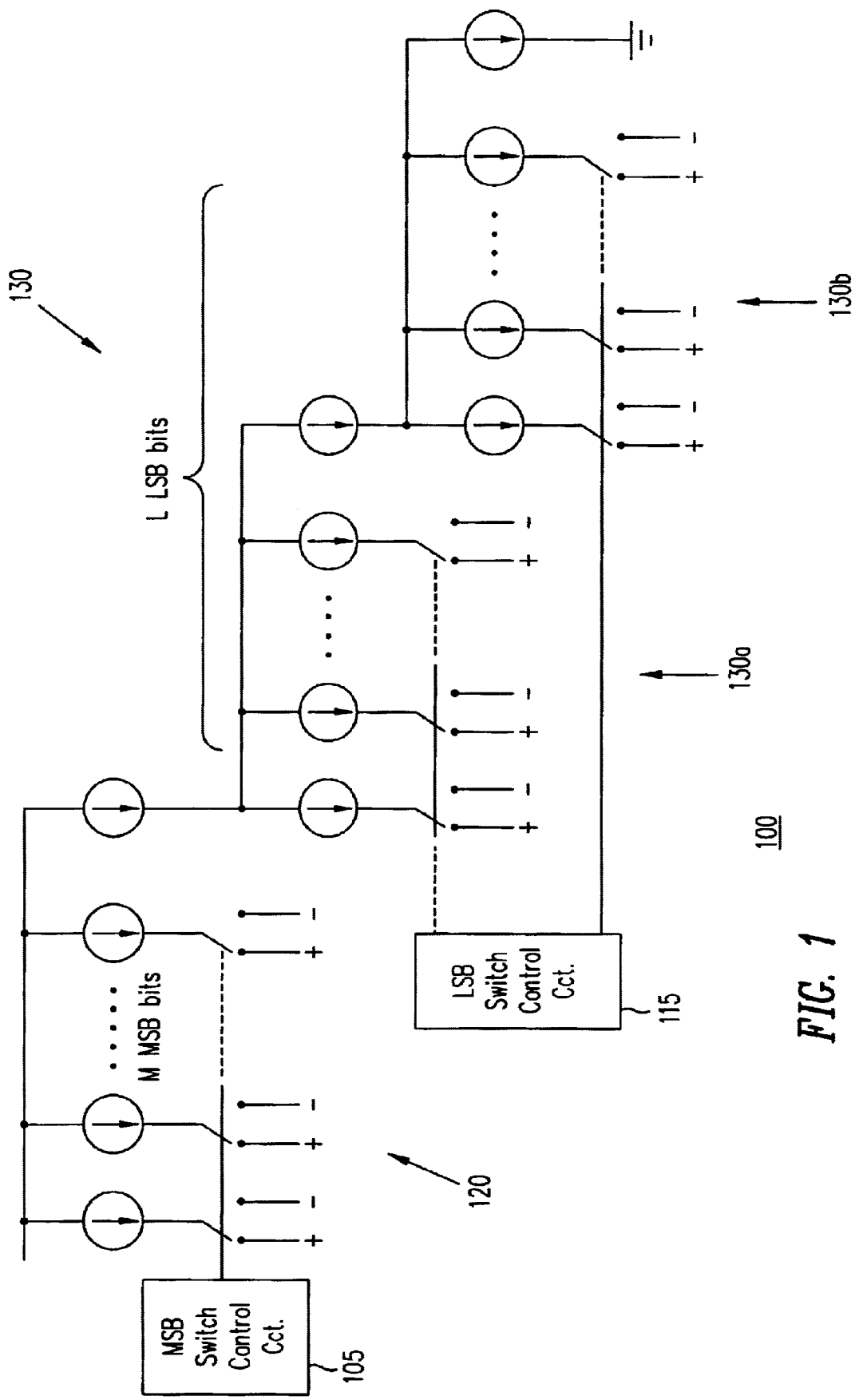
FIG. 1 shows a current mode DAC 100, in accordance with one embodiment of the present invention.

FIG. 1 shows DAC 100, in accordance with one embodiment of the present invention. In FIG. 1, DAC 100 includes M-bit most significant bit (MSB) segment 120 and L-bit least significant bit (LSB) segment 130. LSB segment 130 is formed by sub-segments 130a and 130b. The operations of MSB segment 120 and LSB segment 130 are controlled by MSB and LSB switch control circuits 105 and 115, respectively. For static linearity considerations, MSB segment 120 is preferably thermometer-encoded, while LSB segment 130 is preferably thermometer-encoded in LSB sub-segment 130*a* and binary-encoded in LSB sub-segment 130*b*. DAC 100 differs from a conventional current mode DAC in at least two ways. First, additional redundant least significant bits (i.e., finer subdivisions than nominally required for its maximum resolution) are introduced in LSB segment 130. Second, MSB and LSB switch control circuits 105 and 115 operate the current source in each bit of DAC 100 in one of three states: positive differential output, negative differential output, and disabled. In the disabled state, a current source is effectively removed from the circuit. (The positive and negative output states route the output current of a current source to its positive and negative differential output terminals, respectively). The area cost of providing additional LSB bits is relatively small because of the lower weighting of the LSB bits. Similarly, the area cost of providing the disabled state for each current source is also relatively small because only a small incremental amount of circuit complexity is required. Other than these differences, the design of DAC 100 can be substantially the same as a conventional, similarly segmented DAC. Thus, the analog performance of DAC 100 can achieve substantially the analog performance of a counterpart conventional DAC.

Figure 2:
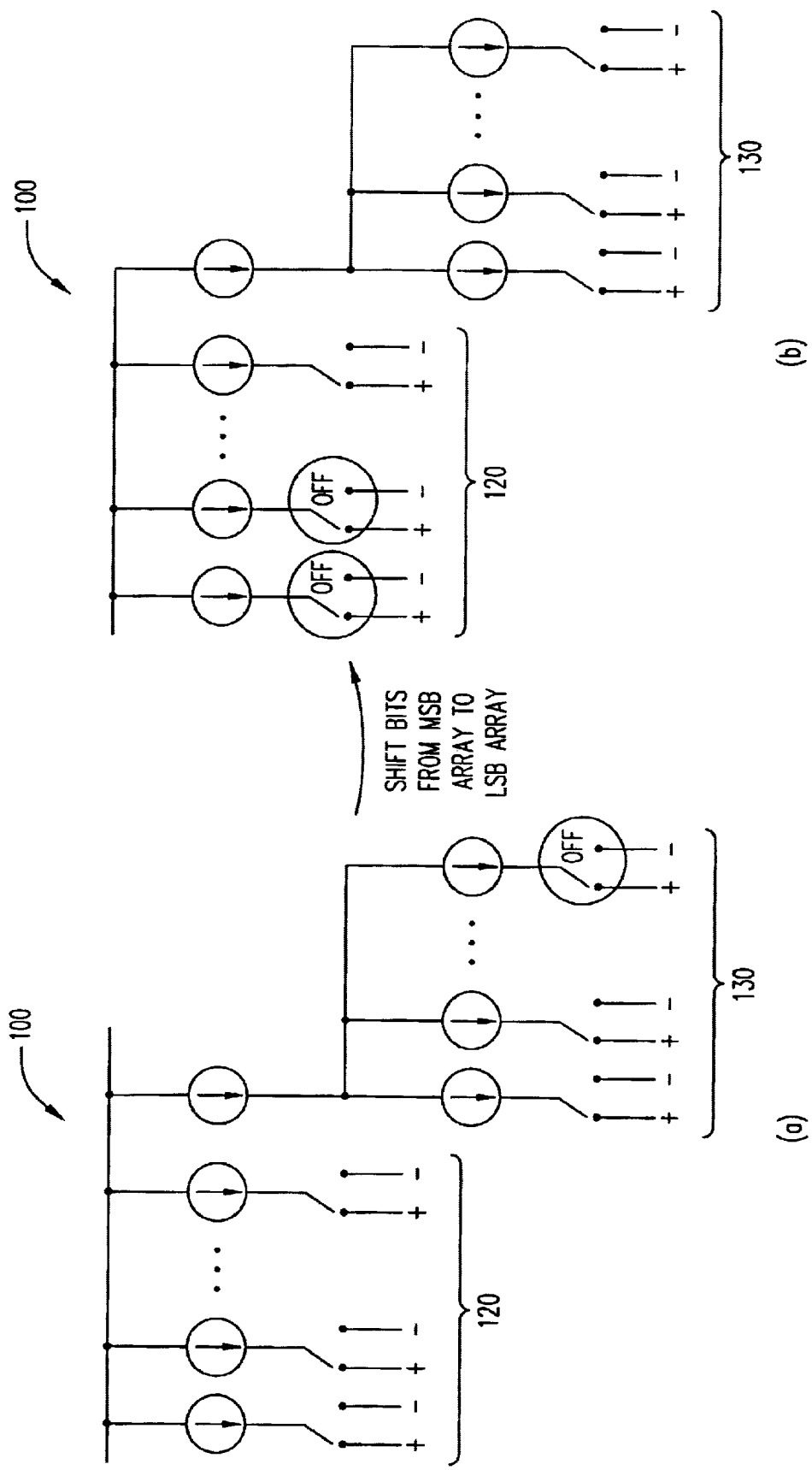
FIG. 2(a) shows, in DAC 100, certain LSB current sources in LSB segment 130 are disabled.
FIG. 2(b) shows how DAC 100 is reconfigured from the configuration of FIG. 2(a) to the configuration shown in FIG. 2(b), as the sampling rate is reduced.

For a given maximum resolution of N bits, current mode segmented DAC 100 has a variable power consumption that scales with a range of clock speeds, while maintaining comparable performance to a DAC custom-designed to any part of that range of clock speeds. (Because current mode segmented DAC 100 includes additional redundant LSBs, N<M+L, where M and L are respectively the implemented lengths of MSB segment 120 and LSB segment 130, as indicated above). With DAC 100 operating at its maximum resolution N, LSB switch control circuit 115 disables the redundant current sources in LSB segment 130, as shown in FIG. 2(*a*). The number of such disabled current sources is equal to the difference term M+L−N. In this configuration, DAC 100 has a maximum number of thermometer-coded MSB current sources, and a minimal number of binary- or thermometer-encoded LSB current sources. Thus, DAC 100 has the same performance as a conventional current mode segmented DAC having the same number of thermometer-encoded and binary-encoded sources.

Consider reconfiguring DAC 100 for a reduction of sampling rate by a factor of m. (To simply the description herein, m is selected to be a power of 2; of course, other factors are possible and represent simply another application of the principles described herein) For example, a typical operational sampling rate range for DAC 100 can be between 160 million samples per second (MS/s) and 2.5 MS/s (i.e., m=64). Ideally, DAC 100 should reduce power consumption by this factor of m. In a current mode digital/analog converter, this power reduction is achieved by decreasing the full-scale current I by the factor m. In some custom implementations, for this current reduction, circuit time constants are allowed to rise by a factor of m. (The term "time constant" refers to the gm/C time constant at a current source switching node, C being the parasitic capacitance at the switching node and gm the switch transconductance.) Alternatively, in other custom implementations, the high speed time constants are maintained to obtain better dynamic performance through the resulting improved ratios of the time constants to the sampling rate.

Typically, when the time constants are permitted to vary, transistor sizes are kept the same for low speed DACs as for high speed DACs because of static linearity concerns, which are impacted by transistor matching. Hence, in some custom implementations, transistors are similarly sized for DACs with widely different operating speed but similar static linearity requirements. DAC 100 can achieve the performance of these custom implementations by simply reducing the current in each current source by a factor of m. Over this current range, C remains unchanged regardless of process used. However, over this current range, transconductance (i.e., gm) is reduced by a factor of m in a bipolar implementation and is reduced by a factor of √m in a CMOS implementation. Consequently, the time constants rise by a factor of m in a bipolar implementation, and by √m in a CMOS implementation. Because the transistor sizes in the active circuit remains unchanged while the current is reduced, DAC 100 maintains static linearity, as desired.

Figure 3A:
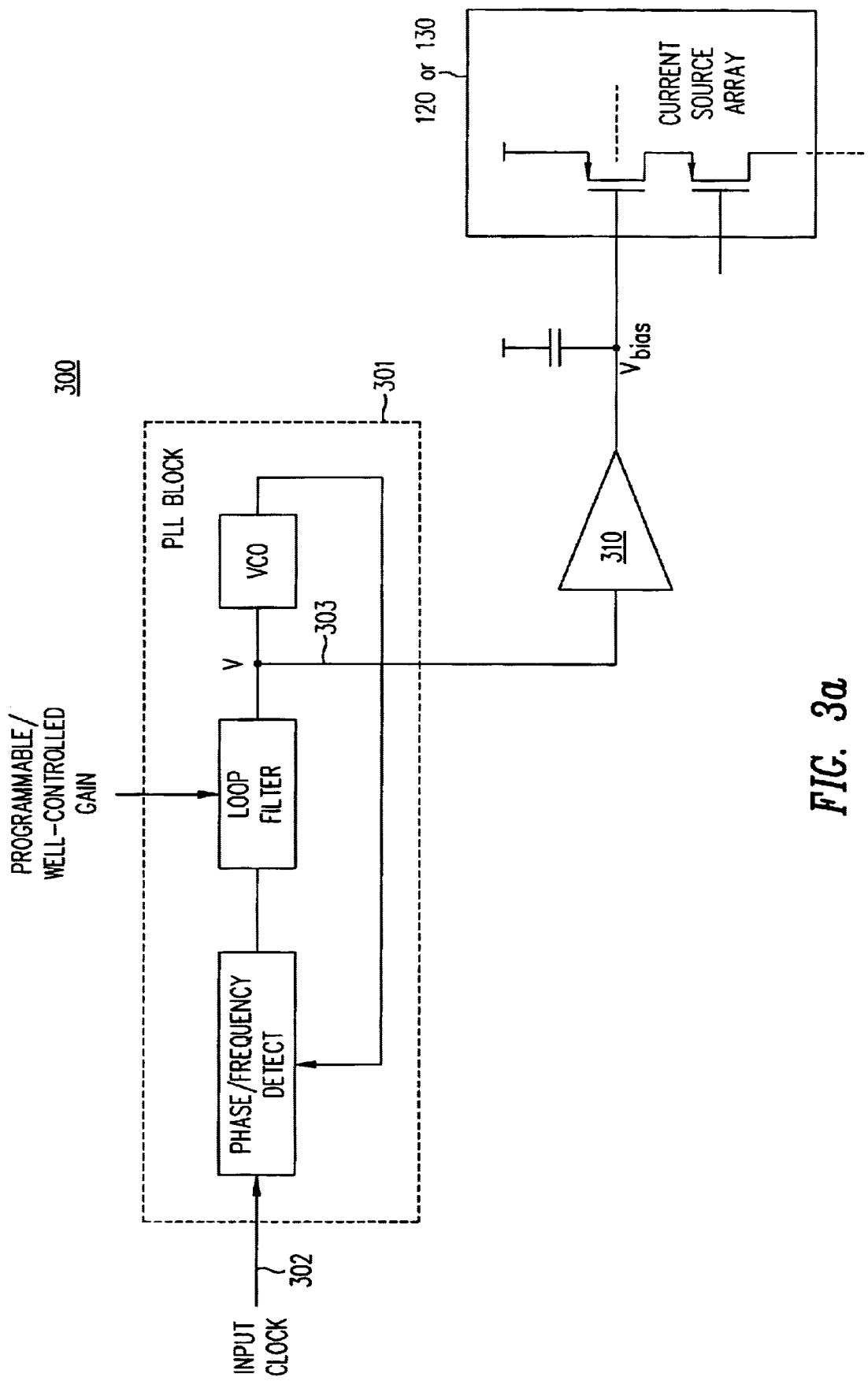
FIG. 3(a) shows circuit 300 that allows the current in a current source to track clock frequency.
Figure 3B:
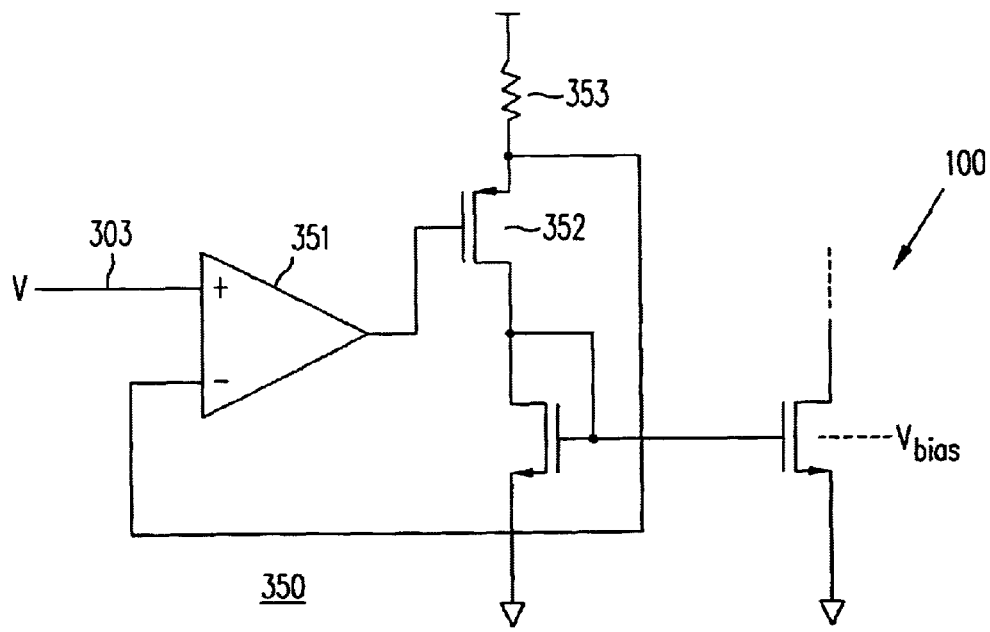
FIG. 3(b) shows matching circuit 350 of gain control and buffer circuit 301.

FIG. 3(*a*) shows circuit 300 which allows the current in a current source of DAC 100 to track the clock frequency. In circuit 300, PLL circuit 301 derives at terminal 303 a DC bias voltage V, which is locked in proportion to the frequency of the input clock signal at terminal 302. DC bias voltage V is buffered by gain control and buffer circuit 310 to generate bias currents in the current source arrays of DAC 100. Generally, while PLL circuit 301's output voltage is linear with frequency to first order, the transconductance of the current sources is nonlinear with frequency. Consequently, the output voltage V cannot drive the current sources directly. Gain control and buffer circuit 301 includes matching circuit 350 (shown in detail in FIG. 3(*b*)) which provides the proper input voltages to the current sources. As shown in FIG. 3(*b*), output voltage V of PLL circuit 301 is first linearized for linear transconductor formed by amplifier 351, PMOS transistor 352 and resistor 353. The output current of the linear transconductor is fed through the inverse transconductance of the current sources of DAC 100 by current mirrorring to generate the bias voltage Vbias. (The current sources themselves may be linearized by degenerating them directly, hence obviating circuit 350. However, in practice, degenerating the current sources degrade their dynamic performance and the voltage headroom of the DAC.)

In custom implementations, when the time constants are maintained, the current sources are scaled down to take full advantage of the fact that transistors can be shrunk in proportion with current, while maintaining the same voltage headroom. This approach is taken where shrinking the transistors does not impact other considerations, particularly matching and linearity. With capacitance C at the transistor switching nodes and the transconductance both scaling linearly with the current (in both bipolar and CMOS implementations, if the CMOS device size is shrunk linearly), the high speed time constants are maintained. To achieve the same performance, DAC 100 is reconfigured to the configuration shown in FIG. 2(*b*). In FIG. 2(*b*), MSB and LSB switch control circuits 105 and 115 disable m current sources in MSB segment 120 and enable m current sources in LSB segment 130 instead. Thus, DAC 100 shifts from the configuration of M current sources in MSB segment 120 and (N−M) current sources in LSB segment 130 to the configuration of (M−m) current sources in MSB segment 120 and (N−M+m) current sources in LSB segment 130, provided m≦M and m≦M+L−N. By shifting m current sources from MSB segment 120 to LSB segment 130, the smaller transistor sizes in LSB segment 130 provide a diminished capacitance in the switching nodes which compensates for the increased transconductances in the switching devices at the reduced current. As a result, the current density in each current source in both MSB and LSB segments 120 and 130 can be maintained, and hence the time constants can remain unchanged. In fact, in some instances, the time constants are lower at the lower sampling rate.

In the configuration of FIG. 2(b), more dependence is placed in LSB segment 130, requiring the additional redundant LSB current source circuits. Note that a considerable number of bits can be placed in the LSBs without incurring a high area cost, or requiring sophisticated calibration techniques to maintain linearity. The selection of whether an MSB current source or an LSB current should be use is determined by the voltage headroom constraint in the current source. In an MOS implementation, the voltage headroom required in each transistor of the current source is proportionally to the square of the current. A current source can be used if the current required does not lead to a voltage headroom violation.

Thus, DAC 100 can accommodate a wide range of sampling rates because: (1) with a suitable distribution of MSB and LSB current sources, there is a suitable configuration for all sampling rates within the range, and (2) as the current density in current the sources remain unchanged between configurations, time constants are unchanged.

If the resolution is reduced from N bits to O bits, the full scale current I can be reduced only logarithmically under expected settling error requirements. As is known to those skilled in the art, although the settling error with N bits is be $2^{N-O}$ times tighter than with O bits, the current required need only be N/O times larger, since the output value settles exponentially to first order. DAC 100 can scale power consumption with this reduced resolution simply by lowering the currents in the current sources by controlling the gain of the PLL-based circuit (e.g., circuit 301) and operating only the current sources required to provide the reduced resolution (i.e., lower the number of enabled bits). This is because linear changes in current within existing current sources have only minor effects on circuit time constants. For example, when the resolution of DAC 100 is lowered from 10 bits to 4 bits in a CMOS implementation, the time constants only rise by a factor of 1.58, as a result of reducing the currents in the current sources. This result is close to the expected performance of a custom implementation and within the 2.5 factor allowable from the settling error viewpoint. In a bipolar implementation, the time constants are slowed down linearly (i.e., by approximately a factor of 2.5). In addition, DAC 100 can be reconfigured, for example, from an 8+2 configuration (i.e., 8 enabled current sources in MSB segment 120 and 2 enabled current sources in the LSB segment 130) to a 2+2 configuration (i.e., 2 enabled current sources in MSB segment 120 and 2 enabled current sources in the LSB segment 130). In these configurations, the current sources are grouped together for switching purpose to keep the current density within acceptable limits.

In some custom implementations, the time constants are maintained by reducing the sizes of the current sources with the reduction in resolution, as decreased transistor matching is not a concern under a reduced resolution. In DAC 100, by reducing the number of current sources employed in MSB segment 120, as shown in FIG. 2(b), without increasing the number in the LSB segment 130 (note that FIG. 2(b) shows additional current sources being enabled in LSB segment 130), the same current density and thus the time constants can be maintained as in the high performance case, due to the reduced capacitance at the switching nodes of the LSB current sources compensating the higher transconductance in the corresponding switching devices at the reduced current. Thus, DAC 100 matches the best performance achievable in a custom implementation Note that reconfiguration of DAC 100 need not usually be accomplished at the DAC update rate itself. That is, DAC 100 is expected to operate between reconfigurations for at least a few clock cycles. This is useful because current source startup can take longer than current source switching (i.e., the time constants involved in current source startup are generally significantly larger than the switching node time constants). In typical applications, several clock cycles are required for the relatively infrequent reconfigurations.

To retain the same full-scale output voltage as the full-scale current I is varied, a current mode DAC may need to have its output load resistance changed in proportion to the current variation for signal-to-noise ratio (SNR) and output matching considerations. However, as extra loads cannot usually be switched in using the imperfect switches available in modern integrated circuit processes. The best switches available (e.g., linear mode MOS transistors) exhibit poorly controlled resistance values which appear as part of the load resistance, as the switch is connected in series with the load. External higher linearity switches, such as those made out of materials like gallium arsenide, can be used at additional cost.

Figure 4:
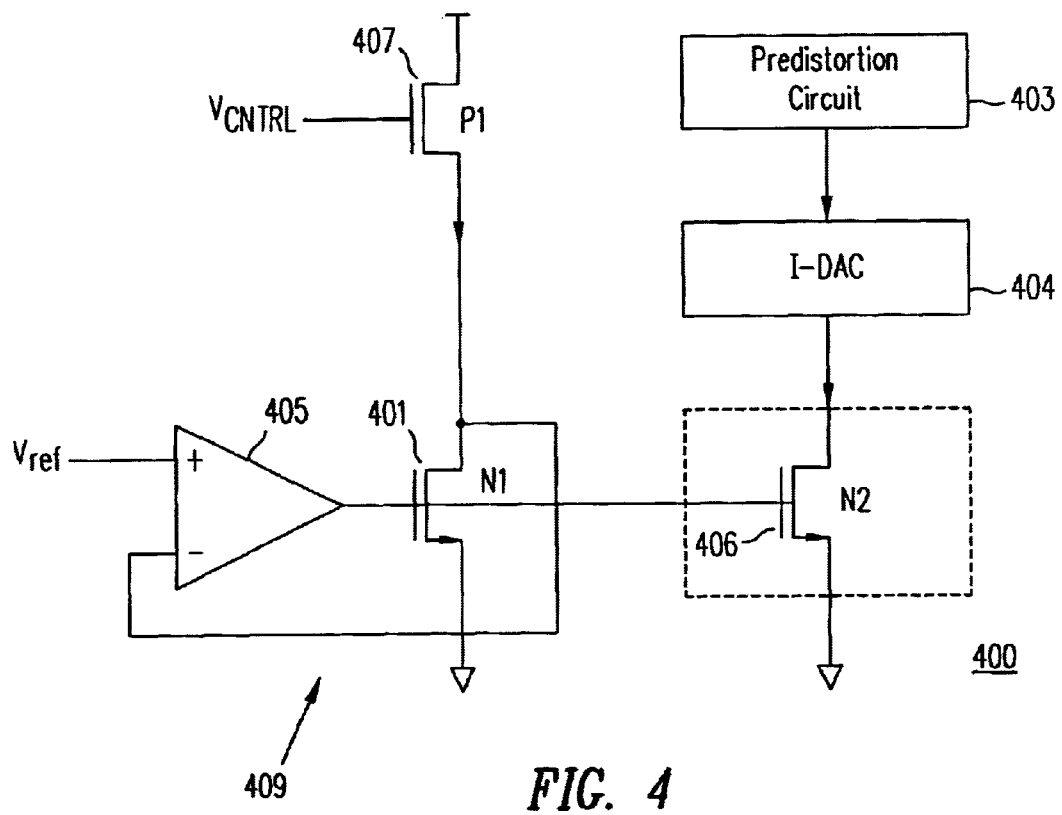
FIG. 4 shows circuit 400 which matches transistor 401 to off-chip resistor 402 for a particular value of drain-source voltage of transistor 402.

FIG. 4 shows circuit 400 which matches transistor 401 to transistor 406 at an output terminal of DAC 100, and acts a "virtual transistor" in an output load of DAC 100. In FIG. 4, "servo loop" 409, which includes amplifier 405 and a voltage reference $V_{ref}$, keeps the drain-to-source voltage of transistor 401 at a constant value. The drain terminal of transistor 401 is coupled to a current source implemented by PMOS transistor 407, which is controlled by a bias voltage $V_{cntrl}$. The current in PMOS transistor 407 provides a current value matched to the total current of DAC 100. Because the voltage at the drain terminal of transistor 401 is kept constant, transistor 401's effective resistance changes as the current in transistor 401 changes in response to bias voltage $V_{cntrl}$. The current in transistor 401 is mirrored in transistor 406, thereby providing transistor 406 as a "virtual resistor" at an output of DAC 100. The disadvantage of circuit 400 is that drain-to-source voltage $V_{ds}$ of transistor 406 (i.e., the output voltage of current source 404) is not fixed to the drain-to-source voltage of transistor 401. Consequently, the nonlinear resistance of transistor 402 arising from the MOSFET transfer characteristics distorts DAC 100's static linearity. This non-linearity is overcome by pre-distorting the digital inputs to DAC 100 in sync with the device characteristics of transistor 406, The required pre-distorting can be readily determined from actual measurement or from simulation to a reasonable level of accuracy. Circuit 400 is then suitable for general operation, so long as the settling time constants at the output are not excessively large relative to the clock period. (Otherwise, the variation in drain-to-source voltage $V_{ds}$ of transistor 406 introduces significant dynamic nonlinearities over each clock period.)

The above detailed descriptions are provided to illustrate specific embodiments of the present invention and are not intended to be limiting. Numerous modifications and variations within the scope of the present invention are possible. For example, for both sampling rate and resolution variations, a combination of the techniques described above (i.e., varying the current in the current sources and reconfiguring the DAC by enabling and disabling MSB and LSB current sources) can be applied to achieve power consumption scaling within the scope of the present invention. The present invention is defined by the appended claims.

I claim:

1. A current mode segmented DAC having a maximum resolution N and capable of operating at a first resolution and at a second resolution, the second resolution being less than the first resolution, comprising:

a first segment of the current mode segmented DAC receiving M input bits, the first segment including one or more current sources, selected ones of the current sources capable of being selectively disabled in response to a control signal;

a second segment of the current mode segmented DAC receiving L input bits, where L>N−M, the second segment including one or more current sources, selected one of the current sources capable of being selectively disabled in response to a control signal; and a control circuit providing the control signals to disable the current sources of the first and second segments of the current mode segmented DAC, wherein when the current mode segmented DAC operates in the second resolution, the control circuit disables one or more of the current sources in the first segment.

2. A current mode segmented DAC as in claim 1, further comprising a third segment.

3. A current mode segmented DAC as in claim 1, wherein the first segment comprises thermometer encoded current sources.

4. A current mode segmented DAC as in claim 1, wherein the second segment comprises binary encoded current sources.

5. A current mode segmented DAC having a maximum resolution N, comprising:

a first segment of the current mode segmented DAC receiving M input bits, the first segment including one or more current sources, selected ones of the current sources capable of being selectively disabled in response to a control signal;

a second segment of the current mode segmented DAC receiving L input bits, where L>N−M, the second segment including one or more current sources, selected one of the current sources capable of being selectively disabled in response to a control signal; and a control circuit providing the control signals to disable the current sources of the first and second segments of the current mode segmented DAC;

wherein the currents in the current sources of the first and second segments are adjustable in response to a bias voltage, the current mode segmented DAC further comprising a voltage source receiving a clock signal and providing the bias voltage, wherein the voltage source provides the bias voltage in proportion to the frequency of the clock signal.

6. A current mode segmented DAC as in claim 5, wherein the voltage source comprises a phase-locked loop and a linearized transconductor.

7. A current mode segmented DAC having a maximum resolution N, comprising:

a first segment of the current mode segmented DAC receiving M input bits, the first segment including one or more current sources, selected ones of the current sources capable of being selectively disabled in response to a control signal;

a second segment of the current mode segmented DAC receiving L input bits, where L>N−M, the second segment including one or more current sources, selected one of the current sources capable of being selectively disabled in response to a control signal; and a control circuit providing the control signals to disable the current sources of the first and second segments of the current mode segmented DAC;

wherein the current sources of the first and second segments are each coupled to a virtual resistor at an output terminal, the current mode segmented DAC further comprising:

a voltage-controlled current source having an output terminal and receiving a control voltage;

a transistor having a gate terminal coupled to a control terminal of the virtual resistor, the transistor being coupled between the output terminal of the voltage-controlled current source and a reference voltage; and a servo-loop receiving an reference voltage and coupled to maintain a constant voltage at the output terminal of voltage-controlled current source.

8. A current mode segmented DAC as in claim 7, further comprising a pre-distortion circuit, such that the voltage-current relationship of the virtual resistor remains linear as its current is being varied.

9. In a current mode segmented DAC having a maximum resolution N, a method comprising:

providing a first segment of the current mode segmented DAC receiving M input bits, the first segment including one or more current sources, wherein selected ones of the current sources in the first segment are capable of being selectively disabled in response to a control signal;

providing a second segment of the current mode segmented DAC receiving L input bits, where L>N−M, the second segment including one or more current sources, wherein selected ones of the current source in the second segment are capable of being selectively disabled in response to control signal; and providing the control signals to selectively disable the current sources in the first and second segments of the current mode segmented DAC;

wherein the current mode segmented DAC is capable of operating at a first resolution and at a second resolution, the second resolution being less than the first resolution, and wherein, when the current mode segmented DAC operates in the second resolution, the method further comprising disabling one or more of the current sources in the first segment.

10. A method as in claim 9, further comprising grouping the one or more current sources in the first segment to be switched together.

11. A method as in claim 10, wherein the method maintains substantially the current densities in the current sources of the first and second segments to achieve substantially the same time constants operating at the first resolution as operating at the second resolution.

12. A method as in claim 9, wherein the first segment comprises thermometer encoded current sources.

13. A method as in claim 9, wherein the second segment comprises binary encoded current sources.

14. In a current mode segmented DAC having a maximum resolution N, a method comprising:

providing a first segment of the current mode segmented DAC receiving M input bits, the first segment including one or more current sources, wherein selected ones of the current sources in the first segment are capable of being selectively disabled in response to a control signal;

providing a second segment of the current mode segmented DAC receiving L input bits, where L>N−M, the second segment including one or more current sources, wherein selected ones of the current source in the second segment are capable of being selectively disabled in response to control signal; and providing the control signals to selectively disable the current sources in the first and second segments of the current mode segmented DAC;

wherein the current mode segmented DAC is capable of operating at a first resolution and at a second resolution and wherein, when the in the second resolution mode, the method further comprising adjusting the current in the first and second segments in proportion to a ratio of the first resolution to the second resolution.

15. A method as in claim 14, wherein the adjusting comprises adjusting the gain of a phase-locked loop.

16. In a current mode segmented DAC having a maximum resolution N, a method comprising:

provinding a first segment of the current mode segmented DAC receiving M input bits, the first segment including one or more current sources, wherein selected ones of the current sources in the first segment are capable of being selectively disabled in response to a control signal;

providing a second segment of the current mode segmented DAC receiving L input bits, where L>N−M, the second segment including one or more current sources, wherein selected ones of the current source in the second segment are capable of being selectively disabled in response to control signal; and providing the control signals to selectively disable the current sources in the first and second segments of the current mode segmented DAC;

wherein the current mode segmented DAC is capable of operating at a first sampling rate and at a second sampling rate, the second sampling rate being less than the first sampling rate, and wherein, when the current mode segmented DAC operates in the second sampling rate, the method further comprises adjusting the currents in the first and second current sources in proportion to the frequency of the clock signal.

17. A method as in claim 16, wherein the adjusting comprises:

providing a voltage that varies linearly with the frequency of the clock signal; and providing a linearizing circuit receiving the voltage, the linearizing circuit adjusting the first and second current sources in amounts necessary to achieve a linear response relative to the first and second current sources relative to the frequency of the clock signal.

18. A method as in claim 17, wherein the voltage that varies linearly with the frequency of the clock signal is provided using a phase-locked loop.

19. In a current mode segmented DAC having a maximum resolution N, a method comprising:

providing a first segment of the current mode segmented DAC receiving M input bits, the first segment including one or more current sources, wherein selected ones of the current sources in the first segment are capable of being selectively disabled in response to a control signal;

providing a second segment of the current mode segmented DAC receiving L input bits, where L>N−M, the second segment including one or more current sources, wherein selected ones of the current source in the second segment are capable of being selectively disabled in response to control signal; and providing the control signals to selectively disable the current sources in the first and second segments of the current mode segmented DAC;

wherein the current mode segmented DAC is capable of operating at a first sampling rate and at a second sampling rate, the second sampling rate being less than the first sampling rate, and wherein, when the current mode segmented DAC operates in the second sampling rate, the method further comprises disabling one or more of the current sources in the first segment and enabling one or more of the current sources in the second segment.

20. A method as in claim 19, further comprising grouping the one or more current sources in the first segment to be switched together.

21. A method as in claim 20, wherein the method maintains substantially the current densities in the current sources of the first and second segments to achieve substantially the same time constants when the current source segmented DAC is operating in the first sampling rate as operating in the second sampling rate.

22. In a current mode segmented DAC having a maximum resolution N, a method comprising:

providing a first segment of the current mode segmented DAC receiving M input bits, the first segment including one or more current sources, wherein selected ones of the current sources in the first segment are capable of being selectively disabled in response to a control signal;

providing a second segment of the current mode segmented DAC receiving L input bits, where L>N−M, the second segment including one or more current sources, wherein selected ones of the current source in the second segment are capable of being selectively disabled in response to control signal;

providing the control signals to selectively disable the current sources in the first and second segments of the current mode segmented DAC; and controlling output voltages of the first and the second current sources by matching the output voltages to a voltage responsive to a control voltage.

23. A method as in claim 22, wherein the control voltage varies proportionally with the total current in the current mode segmented DAC.

* * * * *